(12) United States Patent
Chew

(10) Patent No.: US 11,276,667 B2
(45) Date of Patent: Mar. 15, 2022

(54) HEAT REMOVAL BETWEEN TOP AND BOTTOM DIE INTERFACE

(71) Applicant: Intel Corporation, Santa Clara, CA (US)

(72) Inventor: Yen Hsiang Chew, Georgetown (MY)

(73) Assignee: Intel Corporation, Santa Clara, CA (US)

( * ) Notice: Subject to any disclaimer, the term of this patent is extended or adjusted under 35 U.S.C. 154(b) by 203 days.

(21) Appl. No.: 15/396,530

(22) Filed: Dec. 31, 2016

(65) Prior Publication Data

US 2018/0190617 A1    Jul. 5, 2018

(51) Int. Cl.
*H01L 25/065* (2006.01)
*H01L 23/367* (2006.01)
(Continued)

(52) U.S. Cl.
CPC ........ *H01L 25/0657* (2013.01); *H01L 23/053* (2013.01); *H01L 23/3677* (2013.01); *H01L 23/42* (2013.01); *H01L 23/481* (2013.01); *H01L 23/528* (2013.01); *H01L 25/50* (2013.01); *H01L 21/76898* (2013.01); *H01L 21/78* (2013.01); *H01L 23/3732* (2013.01); *H01L 23/49827* (2013.01); *H01L 24/17* (2013.01); *H01L 2224/16225* (2013.01); *H01L 2224/16245* (2013.01); *H01L 2225/06517* (2013.01); *H01L 2225/06541* (2013.01); *H01L 2225/06572* (2013.01); *H01L 2225/06586* (2013.01); *H01L 2225/06589* (2013.01); *H01L 2924/10253* (2013.01); *H01L 2924/15311* (2013.01)

(58) Field of Classification Search
CPC ............. H01L 25/03; H01L 25/04–041; H01L 25/043; H01L 25/046–048; H01L 25/065; H01L 25/0657; H01L 25/07; H01L 25/074; H01L 25/075; H01L 25/0756; H01L 27/117; H01L 25/16; H01L 25/18; H01L 25/50; H01L 23/34; H01L 23/345–4012; H01L 2023/4018–4068; H01L 21/4882; H01L 21/76898; H01L 23/481
See application file for complete search history.

(56) References Cited

U.S. PATENT DOCUMENTS 5,552,633 A * 9/1996 Sharma ............... H01L 25/0652
257/700
6,611,057 B2 * 8/2003 Mikubo .................. H01L 23/36
257/713

(Continued)

FOREIGN PATENT DOCUMENTS

EP        2555239 A2   2/2013
WO   WO 2009137286 A1  11/2009

OTHER PUBLICATIONS

International Search Report dated Jun. 11, 2018, in International Application No. PCT/US2018/012078, filed Jan. 2, 2018; 4 pages.

*Primary Examiner* — Maliheh Malek
(74) *Attorney, Agent, or Firm* — Schwabe, Williamson & Wyatt, P.C.

(57) ABSTRACT

Heat dissipation technology in a die stack is disclosed. In one example, an electronic device comprises a pair of electrically coupled dies; and a heat spreader disposed between the pair of dies and electrically isolated from an electrical connection between the pair of dies.

17 Claims, 5 Drawing Sheets

(51) Int. Cl.
  *H01L 23/053* (2006.01)
  *H01L 23/42* (2006.01)
  *H01L 23/48* (2006.01)
  *H01L 23/528* (2006.01)
  *H01L 23/498* (2006.01)
  *H01L 23/373* (2006.01)
  *H01L 25/00* (2006.01)
  *H01L 21/768* (2006.01)
  *H01L 21/78* (2006.01)
  *H01L 23/00* (2006.01)

(56) References Cited

U.S. PATENT DOCUMENTS

| | | | | |
|---|---|---|---|---|
| 7,279,795 | B2* | 10/2007 | Periaman | H01L 25/0657 257/772 |
| 7,592,697 | B2* | 9/2009 | Arana | H01L 23/473 257/712 |
| 8,110,930 | B2* | 2/2012 | Periaman | H01L 25/0657 257/690 |
| 8,198,716 | B2* | 6/2012 | Periaman | H01L 24/73 257/686 |
| 8,492,911 | B2* | 7/2013 | Bachman | H01L 21/76895 257/796 |
| 8,901,748 | B2* | 12/2014 | Manusharow | H01L 25/0655 257/652 |
| 8,941,233 | B1* | 1/2015 | Ngai | H01L 25/50 257/712 |
| 9,368,566 | B2* | 6/2016 | Lee | H01L 28/40 |
| 9,490,196 | B2* | 11/2016 | Teh | H01L 23/498 |
| 9,691,696 | B2* | 6/2017 | Shen | H01L 23/49827 |
| 9,842,827 | B2* | 12/2017 | Zhao | H01L 24/13 |
| 9,941,251 | B2* | 4/2018 | Hung | H01L 25/0657 |
| 10,141,239 | B2* | 11/2018 | Lin | H01L 24/29 |
| 10,892,219 | B2* | 1/2021 | Pietambaram | H01L 23/3157 |
| 2005/0136640 | A1* | 6/2005 | Hu | H01L 23/142 438/612 |
| 2006/0060963 | A1* | 3/2006 | Chang | H01L 25/0652 257/706 |
| 2006/0113663 | A1* | 6/2006 | Yuan | H01L 23/4334 257/718 |
| 2006/0244128 | A1* | 11/2006 | Hayashi | H01L 21/563 257/712 |
| 2006/0278974 | A1* | 12/2006 | Hsiao | H01L 23/3128 257/706 |
| 2007/0284730 | A1* | 12/2007 | Shi | H01L 21/50 257/704 |
| 2008/0150125 | A1* | 6/2008 | Braunisch | H01L 25/0657 257/712 |
| 2008/0211081 | A1* | 9/2008 | Lee | H01L 23/481 257/691 |
| 2008/0237310 | A1* | 10/2008 | Periaman | H01L 24/73 228/180.5 |
| 2008/0315388 | A1* | 12/2008 | Periaman | H01L 25/0652 257/690 |
| 2008/0315421 | A1* | 12/2008 | Periaman | H01L 25/0657 257/758 |
| 2009/0045487 | A1* | 2/2009 | Jung | H01L 21/76898 257/621 |
| 2009/0065951 | A1* | 3/2009 | Cheah | H01L 25/0657 257/778 |
| 2009/0108435 | A1* | 4/2009 | Bernstein | H01L 25/0657 257/691 |
| 2010/0187670 | A1 | 7/2010 | Lin et al. | |
| 2010/0187681 | A1* | 7/2010 | Chen | H01L 23/49827 257/712 |
| 2010/0213600 | A1* | 8/2010 | Lau | H01L 23/055 257/693 |
| 2011/0024888 | A1* | 2/2011 | Pagaila | H01L 23/13 257/686 |
| 2011/0026232 | A1* | 2/2011 | Lin | H01L 24/24 361/760 |
| 2011/0042795 | A1* | 2/2011 | Knickerbocker | H01L 21/486 257/686 |
| 2011/0101512 | A1* | 5/2011 | Choi | H01L 24/29 257/686 |
| 2011/0143506 | A1* | 6/2011 | Lee | H01L 27/0688 438/238 |
| 2012/0020028 | A1* | 1/2012 | Bachman | H05K 1/0201 361/719 |
| 2012/0049339 | A1* | 3/2012 | Wang | H01L 21/563 257/693 |
| 2012/0049347 | A1* | 3/2012 | Wang | H01L 24/97 257/737 |
| 2012/0049352 | A1* | 3/2012 | Kang | H01L 23/367 257/737 |
| 2012/0146207 | A1* | 6/2012 | Chou | H01L 23/3675 257/690 |
| 2012/0153445 | A1* | 6/2012 | Son | H01L 23/3128 257/668 |
| 2012/0162986 | A1* | 6/2012 | Mekhtarian | A01G 7/045 362/249.01 |
| 2012/0299173 | A1* | 11/2012 | Mohammed | H01L 23/3677 257/686 |
| 2013/0016477 | A1* | 1/2013 | Yokoya | H01L 23/36 361/719 |
| 2014/0225248 | A1* | 8/2014 | Henderson | H01L 21/50 257/712 |
| 2014/0239457 | A1 | 8/2014 | Daubenspeck et al. | |
| 2014/0252579 | A1* | 9/2014 | Chang | H01L 21/76898 257/676 |
| 2014/0299980 | A1* | 10/2014 | Choi | H01L 24/97 257/698 |
| 2015/0130083 | A1* | 5/2015 | Park | H01L 25/0657 257/777 |
| 2016/0005675 | A1* | 1/2016 | Tong | H01L 23/4334 257/675 |
| 2016/0190113 | A1* | 6/2016 | Sharan | H01L 28/00 257/531 |
| 2016/0293497 | A1* | 10/2016 | Eckert | H01L 22/12 |
| 2017/0092510 | A1* | 3/2017 | Oh | H01L 25/0657 |
| 2017/0170155 | A1* | 6/2017 | Yu | H01L 24/19 |
| 2017/0176260 | A1* | 6/2017 | Ferguson | G01K 7/16 |
| 2017/0178994 | A1* | 6/2017 | Hui | H01L 23/345 |
| 2017/0181271 | A1* | 6/2017 | Yee | H05K 1/0271 |
| 2017/0284636 | A1* | 10/2017 | Dittes | H01L 29/00 |
| 2017/0301625 | A1* | 10/2017 | Mahajan | H01L 23/5381 |
| 2017/0345763 | A1* | 11/2017 | Cheah | H01L 23/5387 |
| 2017/0354031 | A1* | 12/2017 | Aoki | H05K 1/0271 |
| 2018/0068989 | A1* | 3/2018 | Chew | H01L 21/565 |
| 2018/0138146 | A1* | 5/2018 | Cheah | H01L 25/0652 |
| 2020/0066679 | A1* | 2/2020 | Bohr | H01L 24/13 |
| 2020/0176436 | A1* | 6/2020 | Albers | H01L 25/0657 |

\* cited by examiner

HEAT REMOVAL BETWEEN TOP AND BOTTOM DIE INTERFACE

TECHNICAL FIELD

Embodiments described herein relate generally to electronic device packaging, and more particularly to a thermal management therein.

BACKGROUND

Conventionally, a bottom die of a stacked die package relies on heat conduction from its active metal layer to the top die, and to the backside of the top die for dissipation.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
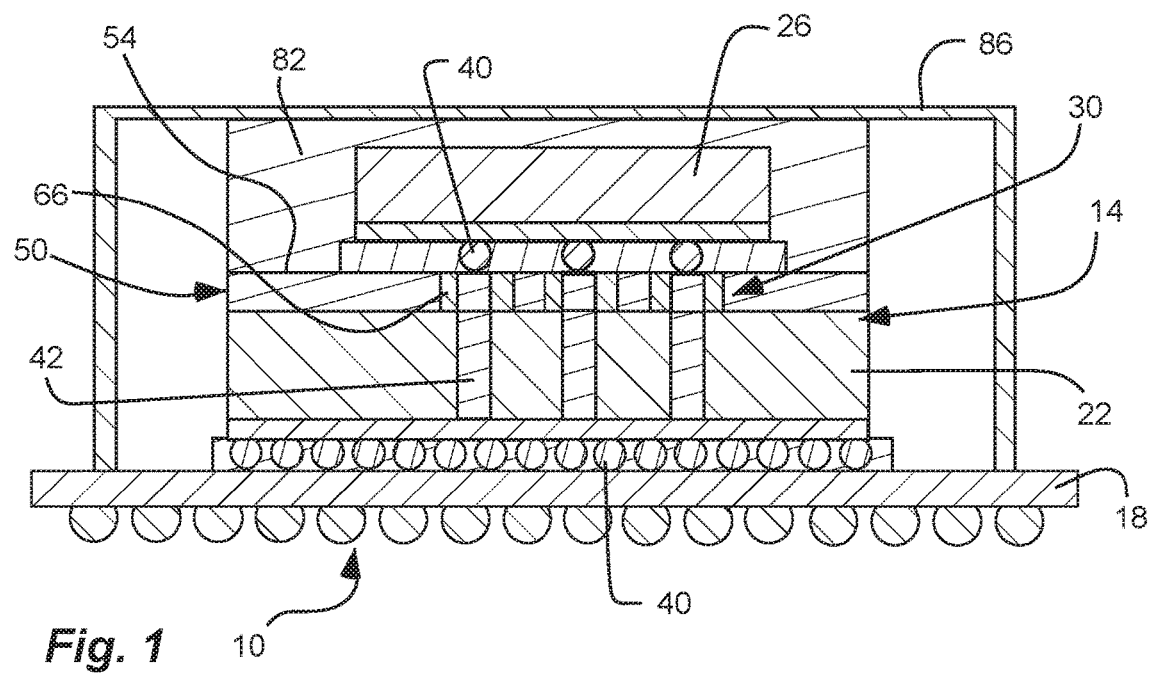
FIG. 1 schematically shows a cross-sectional side view of an electronic device package with a heat spreader in accordance with an example embodiment.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects or items are in physical contact with one another and are attached. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. It is understood that express support is intended for exact numerical values in this specification, even when the term "about" is used in connection therewith.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

In one example, an electronic device comprises a pair of electrically coupled dies; and a heat spreader disposed between them, and electrically isolated from them. The heat spreader (e.g. a metal plane) can be located (e.g. embedded) in between top and bottom dies to spread heat generated by the bottom die (including hot spots) through conduction. In this way, the bottom die doesn't rely primarily on the top die as an exit for its heat, but rather has heat dissipated laterally by the heat spreader to exit the side of the device.

In some embodiments, the head spreader can be a thin layer of metal plane inserted in between an interconnect interface of the top and bottom dies, for example, dies of a stacked die multi-chip semiconductor package assembly. In one aspect, the interconnect interface can comprise a backside of the bottom die with exposed through silicon via (TSV) pads and an active metal layer of the top die. In one aspect, through silicon vias (TSVs) can be extended beyond the exposed backside of a silicon wafer during wafer processing and handling. The backside of the silicon wafer can be metalized at areas where there are no TSVs to create the metal plane, and thus the heat spreader. The TSVs can be insulated from the backside metal plane or heat spreader using an electrical insulating mold compound. The top die can be stacked at the surface with the metal plane and the insulated extended TSVs. The heat spreader can function to spread heat from hot spots below the top die to side areas of the heat spreader or metal plane for dissipation; so that these hot spots do not have to rely solely on heat conduction to the top die, and then to the backside of the top die for dissipation. The heat spreader or metal plane can provide better heat dissipation for a bottom die in many different die stacked die arrangements, including in a stacked die multi-chip package assembly. Further, the heat spreader or metal plane can provide better heat dissipation at the interconnect interface between a bottom die and a top die in a stacked die multi-chip package assembly; and can spread the heat generated by hot spots below a top die to reduce negative thermal effects of hot spots to the overall function of the dies in a stacked die semiconductor package.

Figure 2:
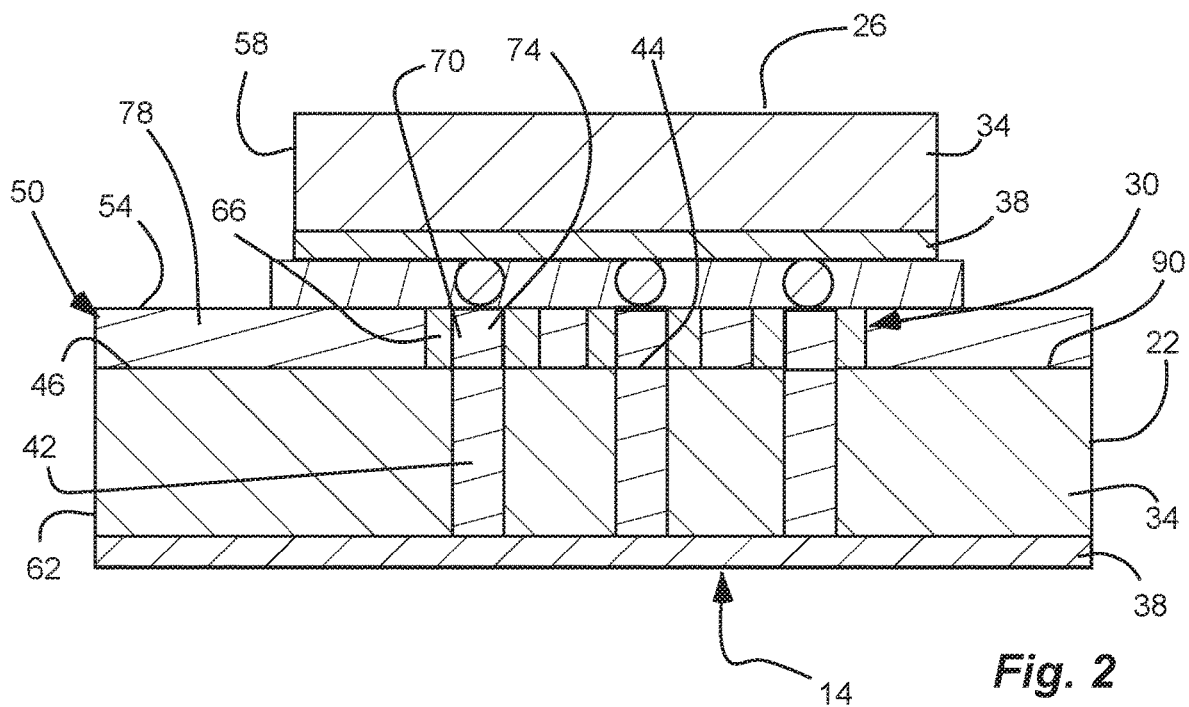
FIG. 2 schematically shows a cross-sectional side view of an electrical device of the electronic device package of FIG. 1.

Referring to FIGS. 1 and 2, an exemplary electronic device package 10 and an exemplary electronic device 14 thereof are schematically illustrated in cross-section, respectively. The electronic device package 10 can comprise the electronic device 14. In addition, the electronic device package 10 can comprise a substrate 18. The electronic device 14 can be operably coupled to the substrate 18. In one aspect, the electronic device 14 can comprise a pair of electrically coupled dies; for example a bottom die 22 and a top die 26 disposed over the bottom die 22. In addition, the top and bottom dies 26 and 22, can be electrically coupled to the substrate 18. An electrical connection or interconnect interface 30 can be formed and/or disposed between the pair of dies, and the top and bottom dies 26 and 22.

The electronic device 14 can be or can comprise any electronic device(s) or component(s) that may be included in an electronic device package, such as a semiconductor device (e.g., a die, a chip, a processor, computer memory, etc.). In one aspect, each of the electronic components may represent a discrete chip, which may include an integrated circuit. The electronic components may be, include, or be a part of a processor, memory (e.g., ROM, RAM, EEPROM, flash memory, etc.), or an application specific integrated circuit (ASIC). In one aspect, one or more of the electronic components can be a system-on-chip (SOC) or a packageon-package (POP). In another aspect, the electronic device package can be a system-in-a-package (SIP).

In some embodiments, the electronic components or dies can be in a stacked relationship or configuration, for example, to save space and enable smaller form factors. Although two die are depicted in FIGS. 1 and 2, any suitable number of electronic components or dies can be included in a stack. While in such a stacked relationship, multiple electronic components or dies can include an electrical interconnect portion (e.g., including an interconnect pad such as a wire bond pad) exposed toward the substrate. In other words, electrical interconnect portions of multiple stacked electronic components or dies can face the substrate 18. In the illustrated example, each of the electronic components or dies includes an electrical interconnect portion exposed toward the substrate.

In one aspect, each of the pair of dies, and the top and bottom dies 26 and 22, can comprise silicon 34 with an active layer 38. The active layer 38 can face the substrate 18. In addition, the bottom die 22 can have through silicon vias (TSVs) 42 extending through the bottom die 22 and/or silicon 34 thereof. The bottom die 22 can be disposed over and electrically coupled to the substrate 18. The bottom die 22 and/or active layer 38 thereof can be electrically coupled to the substrate 18 by electrically conductive solder material 40 (e.g., solder balls, solder bumps, microbumps). In one aspect, a backside of the bottom die 22 can have exposed TSV pads 44. The active layer 38 of the top die 26 can face the bottom die 22, and the substrate 18. The top die 26 can be disposed over the bottom die 22, and electrically coupled to the TSVs 42, and/or the TSV pads 44. The top die 26 and/or active layer 38 thereof can be electrically coupled to the TSVs 42 and/or the TSV pads 44 by electrically conductive solder material 40 (e.g., solder balls, solder bumps, microbumps). The electrical connection and/or interconnect interface 30 can be disposed between the top and bottom dies 26 and 22, and can comprise the electrical connection of the top die 26 to the TSVs 42, and/or the TSV pads 44. The electrical connection and/or the interconnect interface 30 can comprise the TSVs 42 extending through the bottom die 22 and electrically coupled to the top die 26.

In one aspect, a portion 46 of one die (e.g. the bottom die 22) can extend beyond, and can be exposed beyond, another die (e.g. the top die 26). In one aspect, the bottom die 22 can be larger than the top die 26, as shown. In another aspect, the top die can be off-set with respect to the bottom die. In one aspect, at least a perimeter 62 of the bottom die 22 can extend laterally beyond a perimeter 58 of the top die 26, defining a step 90, as described below.

A heat spreader 50 can be disposed between the pair of dies, and the top and bottom die 26 and 22. In addition, the heat spreader 50 can be electrically isolated from the electrical connection 30 between the pair of dies, or top and bottom dies 26 and 22. The heat spreader 50 can be embedded between the top and bottom dies 26 and 22, and electrically isolated from the TSVs 42. In one aspect, the heat spreader 50 can be or can comprise a metal plane, and can be formed by metallization, as described below.

In one aspect, at least a portion 54 of the heat spreader 50 can be exposed from between the pair of dies, and the top and bottom dies 26 and 22, to dissipate heat from between the top and bottom dies 26 and 22. In another aspect, the heat spreader 50 can extend beyond a perimeter 58 of at least one of the pair of dies, and the top and bottom dies 26 and 22. For example, the heat spreader 50 can extend beyond the perimeter 58 of the top die 26. In another aspect, the heat spreader 50 can extend to at least a perimeter 62 of at least one of the pair of dies, and the top and bottom dies 26 and 22. For example, the heat spreader 50 can extend to the perimeter 62 of the bottom die 22. Thus, the heat spreader 50 can be exposed to facilitate heat transfer or conduction. In one aspect, the heat spreader 50 can be disposed on at least one of the pair of dies, and the top and bottom dies 26 and 22. For example, the heat spreader 50 can be disposed on the bottom die 22. The heat spreader 50 can be disposed on and carried by a back side of a die (e.g. the bottom die 22), opposite the active layer 38. Disposing the heat spreader 50 on a die (e.g. the bottom die 22) can facilitate manufacture of the electronic device 14 and/or electronic device package 10, and can facilitate locating the heat spreader 50 between the dies 22 and 26. In one aspect, the heat spreader 50 can extend from between the top and bottom dies 26 and 22, and onto the step 90, as discussed below. The exposed portion 54 of the heat spreader 50 can be disposed on the step 90.

The heat spreader 50 can be isolated and/or laterally isolated from the TSVs 42 by an electrical insulator 66. The electrical insulator 66 can be disposed between the heat spreader 50 and the TSVs 42. The electrical insulator 66 can laterally surround the TSVs 42. In addition, the electrical insulator 66 can extend from the back side of the bottom die 22 to the electrical connection and/or the interconnect interface 30 with the top die 26. The heat spreader 50 can be laterally spaced-apart from the TSVs 42. In addition, the heat spreader 50 can circumscribe the TSVs 42, and can extend between the TSVs 42. Thus, a surface area of the heat spreader 50 can be maximized or optimized to maximize or optimize heat transfer from the dies 22 and 26 to the heat spreader 50.

As stated above, in one aspect, the heat spreader 50 can be, or can comprise, a metal plane. In one aspect, a first metallization 70 can be disposed on the TSVs 42, and can form extensions of the TSVs or extended TSVs 74 that can be electrically coupled to the top die 26. In one aspect, the extensions of the TSVs or extended TSVs 74 can be formed on the TSV pads 44. In another aspect, the extensions of the TSVs or extended TSVs 74 can form TSV pads. A second metallization 78 can be disposed on the bottom die 22, and can define the heat spreader 50. The second metallization 78 can be disposed on the back side of the bottom die 22. In one aspect, the first and second metallizations 70 and 78 can be disposed in the same planar layer. In one aspect, the first and second metallizations 70 and 78 can be formed together at the same time and in the same layer, but separated from one another or isolated from one another, as discussed below. The electrical insulator 66 can be disposed between the first and second metallizations 70 and 78 to electrically isolate the second metallization 78 from the first metallization 70. The electrical insulator 66 can be disposed in the same planar layer as the first and second metallizations 70 and 78.

Referring again to FIG. 1, as described above, the heat spreader 50 can have an exposed portion 54 extending beyond the top die 26. A thermal interface material 82 can be disposed on the exposed portion 54 of the heat spreader 50. In one aspect, the thermal interface material 82 can cover an entire exposed portion 54 of the heat spreader 50. Heat can be conducted through the heat spreader 50 to the thermal interface material 82.

The electronic device package 10 can further comprise a cap 86 disposed on the substrate 18, and over the pair of dies, and the top and bottom dies 26 and 22, and the die stack. In one aspect, the cap 86 can comprise metal or can be a metal cap to facilitate heat transfer. The cap 86 can surround the dies. In addition, the thermal interface material 82 can extend from the exposed portion 54 of the heat spreader 50 and to the cap 86. In addition, the thermal interface material 82 can extend between and can fill a gap between the cap 86 and the top die 26. Thus, heat can be conducted through the heat spreader 50, through the thermal interface material 82, and to the cap 86 to dissipate the heat.

Referring again to FIG. 2, in one aspect, at least the perimeter 62 of the bottom die 22 can extend laterally beyond the perimeter 58 of the top die, defining a step 90. The heat spreader 50 can extend from between the top and bottom dies 26 and 22, and onto the step 90. The thermal interface material 82 can be disposed over the step 90.

Figure 3:
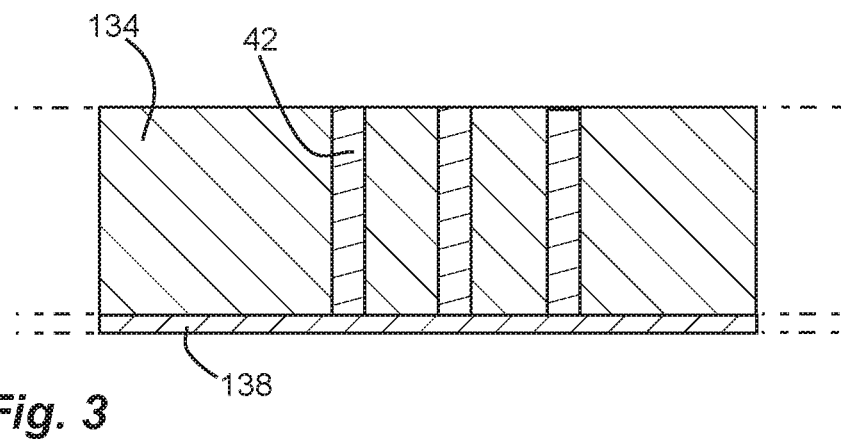
FIGS. 3-10 illustrate a method of making an electronic device in accordance with an example embodiment.

FIGS. 3-10 schematically illustrate a method for making the electronic device 14, such as described with reference to FIG. 2. The method can comprise providing a silicon wafer 134 with an active layer 138 and through silicon vias (TSVs) 42, as shown in FIG. 3.

Figure 4:
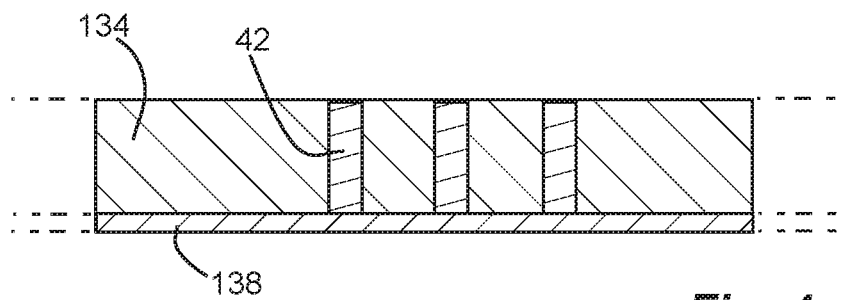

In one aspect, the method can comprise a global thinning process to reduce a thickness of the silicon wafer 134, as shown in FIG. 4.

Figure 5:
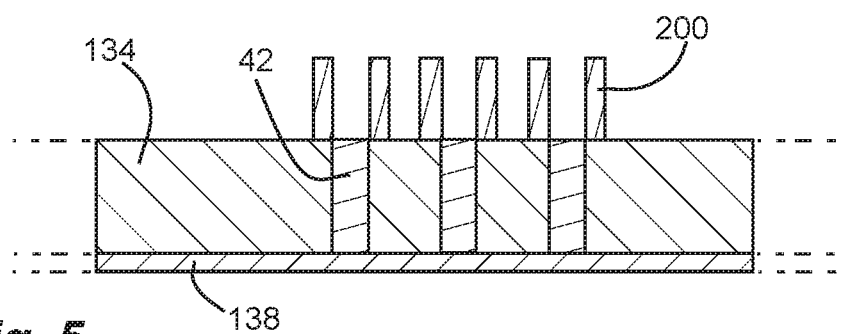

In addition, the method can comprise applying a barrier or template 200 over a back side of the silicon wafer 134 around the TSVs 42, as shown in FIG. 5. In one aspect, the barrier or template 200 can comprise photo resist patterned over the back side of the wafer 134 around the TSVs 42.

Figure 6:
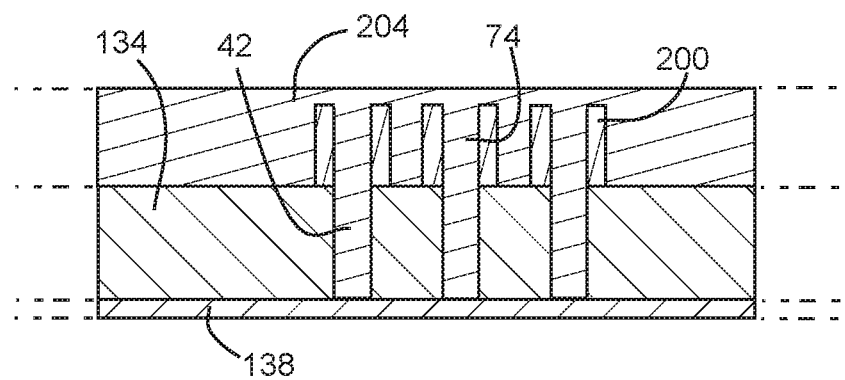

In addition, the method can comprise applying a metallization layer 204 over the back side of the wafer 22, and in areas exposed by the barrier or template 200, or the photo resist, as shown in FIG. 6. The metallization layer 204 can extend the TSVs 42 to form extended TSVs 74. In addition, the metallization layer 204 can define the heat spreader 50 outside the extended TSVs 74, and isolated from the extended TSVs 74. The heat spreader 50 of metallization layer 204 can be separated from the extended TSVs 74 by the barrier or template 200. In one aspect, the metallization layer 204 can cover the barrier or template 200.

Figure 7:
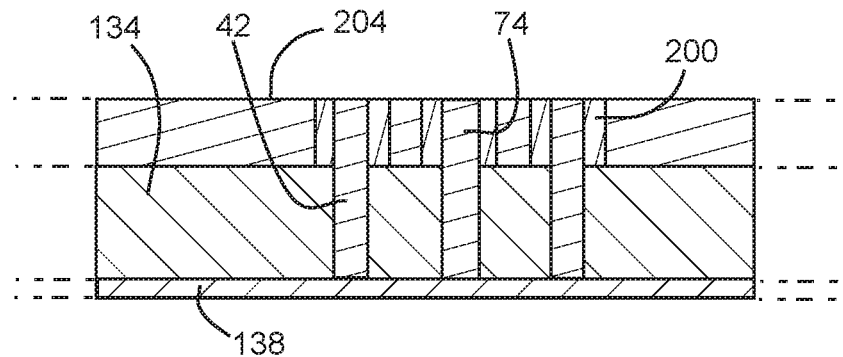

In one aspect, the method can comprise a backside grinding process to remove a portion of the metallization layer 204 and expose the extended TSVs 74, the heat spreader 50, and/or the barrier or template 200, as shown in FIG. 7. In one aspect, the backside grinding process may further comprise removing a top portion of the barrier or template 200 including a top portion of the metallization layer 204 and a top portion of the extended TSVs 74 to further reduce the z-height of the extended TSVs and the overall z-height of the stacked dies.

Figure 8:
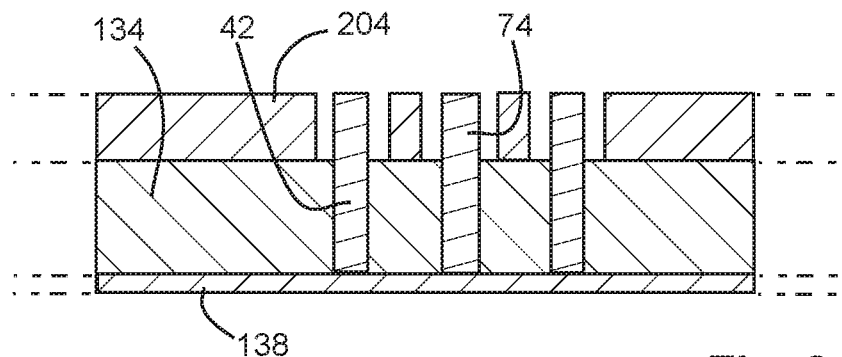

In addition, the method can comprise removing the barrier or template 200 from the silicon wafer 134, as shown in FIG. 8. In one aspect, the photo resist can be removed from between the heat spreader 50 and the extended TSVs 74.

Figure 9:
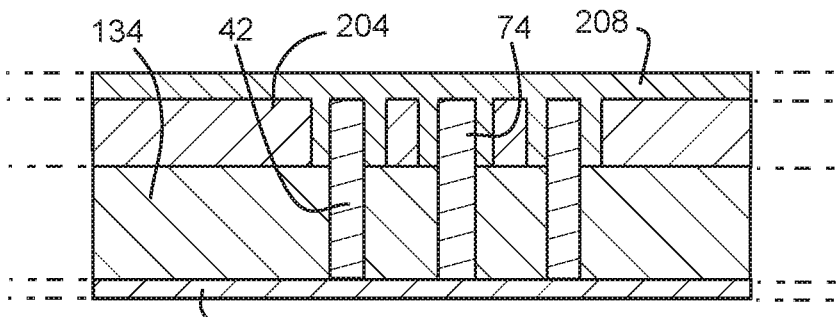

In addition, the method can comprise applying an electrically insulative material 208 over the metallization layer 204, as shown in FIG. 9. The electrically insulative material 208 can extend between the heat spreader 50 and the extended TSVs 74.

Figure 10:
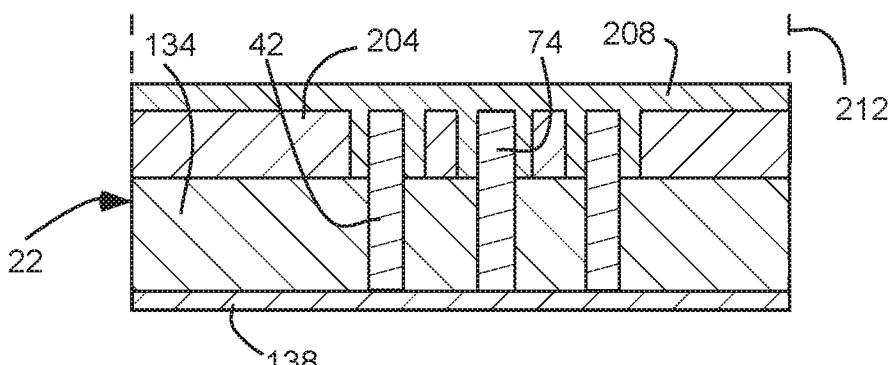

Furthermore, the method can further comprise singulating the wafer 134 (represented by lines 212) to form a die (for example the bottom die 22), as shown in FIG. 10.

Figure 11:
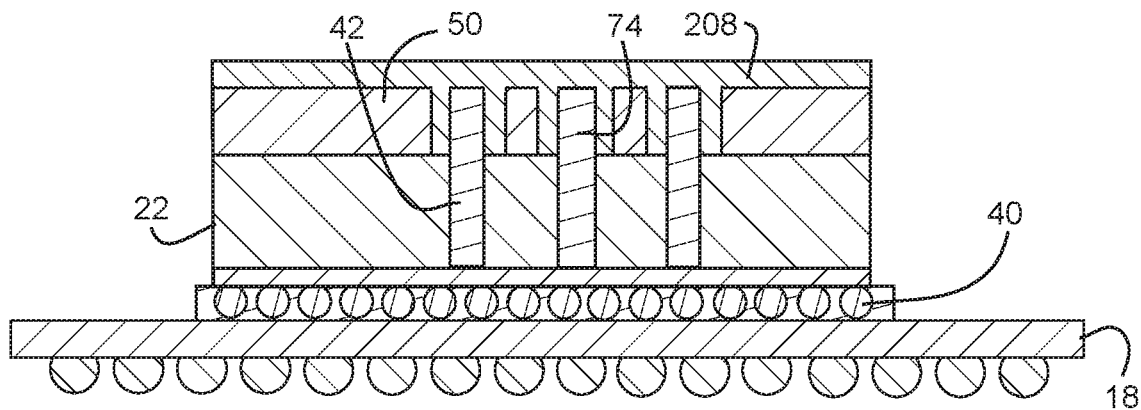
FIGS. 11-14 illustrates a method of making an electronic device package in accordance with an example embodiment.

FIGS. 11-14 schematically illustrate a method for making the electronic device package 10, such as described with reference to FIG. 1. The method can comprise the method of making the electronic device 14, as described above with respect to FIGS. 3-10. In addition, the method can comprise providing a substrate 18. The method can comprise disposing the die (e.g. the bottom die 22) over the substrate 18 and electrically coupling the die (e.g. the bottom die 22) to the substrate 22, as shown in FIG. 11. As described above, the bottom die 22 has through silicon vias (TSVs) 42 extending through the bottom die 22, and a heat spreader 50 disposed over the bottom die 22 and electrically isolated from the TSVs 42. The bottom die 22 can be electrically coupled to the substrate 18 by electrically conductive solder material 40 (e.g., solder balls, solder bumps, microbumps).

Figure 12:
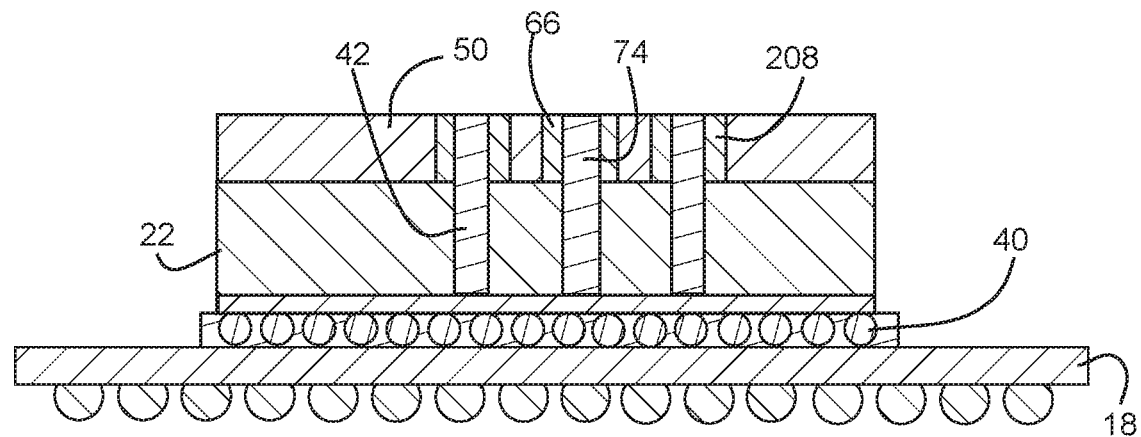
Figure 13:
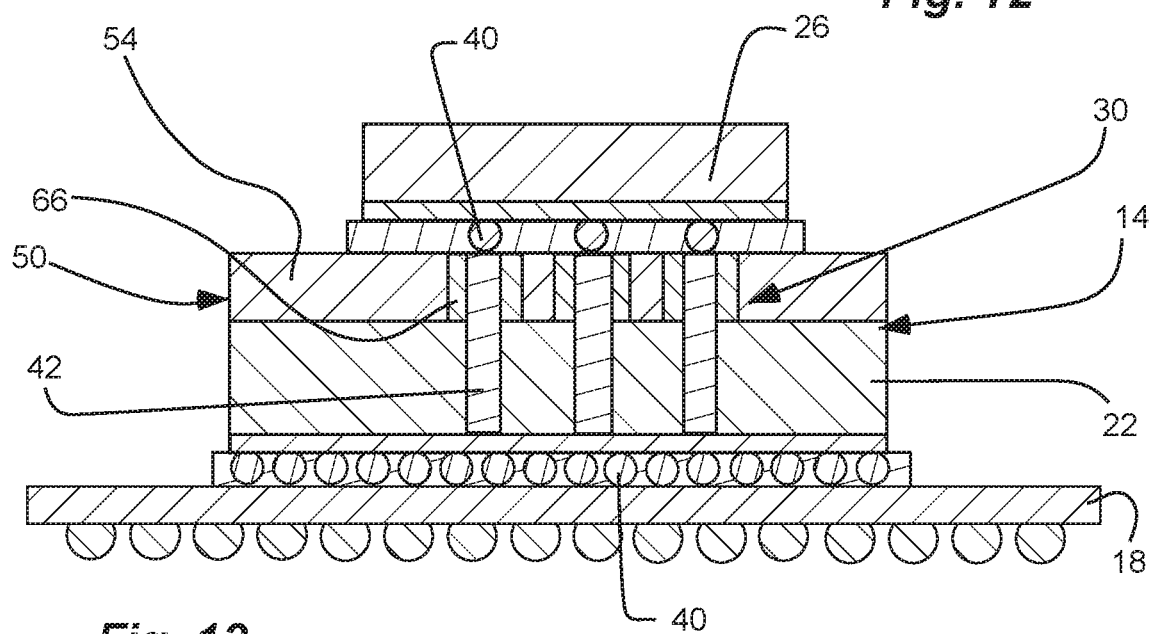

In addition, the method can comprise removing a portion of the electrically insulative material 208 to expose the heat spreader 50 and the extended TSVs 74, and the insulative material 208, and/or electrical insulator 66, between the heat spreader 50 and the extended TSVs 74, as shown in FIG. 12. Removing the insulative material 208 to expose the extended TSVs 74 may be accomplished using, for example, a background grinding process. In one aspect, removing the insolative material 208 to expose the extended TSVs 74 may further comprise removing a top portion of the electrical insulator 66 including a top portion of the exposed heat spreader 50 and a top portion of the extended TSVs 74 to further reduce the z-height of the extended TSVs and the overall z-height if the stacked dies. The method can comprise disposing a top die 26 over the bottom die 22, and electrically coupling the top die 26 to the extended TSVs 74, defining a die stack, as shown in FIG. 13. The top die 26 can be electrically coupled to the extended TSVs 74 and/or TSVs 42 by electrically conductive solder material 40 (e.g., solder balls, solder bumps, microbumps). In one aspect, the top die 26 may be disposed on the bottom die 22 using a surface activated bonding method, defining a stacked die.

Figure 14:
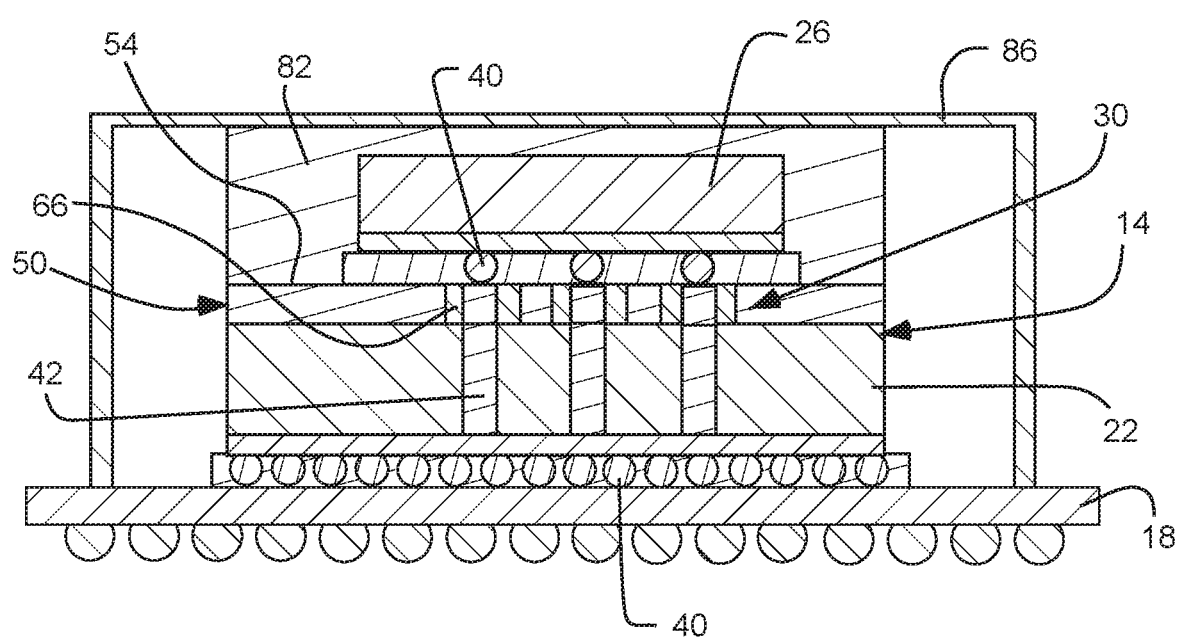

In addition, the method can further comprise applying a thermal interface material 82 to an exposed portion 54 of the heat spreader 50, as shown in FIG. 14. Furthermore, the method can further comprise capping the die stack with a metal cap 86 disposed over the substrate 18 and the die stack, and with the thermal interface material 82 extending from the heat spreader 50 to the metal cap 86, as shown in FIG. 14.

Referring again to FIGS. 1 and 2, a method for transferring heat from an electronic device package 10 and/or an electronic device 14, such as described with reference to FIGS. 1 and 2 is shown. The method can comprise: inserting a heat spreader 50 between an interconnect interface 30 of a top die 26 and a bottom die 22 in the electronic device package 10 and/or electronic device 14; and electrically isolating the heat spreader 50 from electrical connections in the interconnect interface 30. As described above, the interconnect interface 30 can comprise a backside of the bottom die 22 with exposed TSV pads 44 and an active layer 38 of the top die 26. The method can further comprise extending TSVs 42 beyond a backside of a silicon wafer 138, defining extended TSVs 74, as shown in FIGS. 6 and 7. The method can further comprise metalizing the backside of the bottom die 22 outside and spaced-apart from the TSVs 42 and/or 74, defining the heat spreader 50, as shown in FIGS. 6 and 7. The method can further comprise disposing an electrically insulating compound 208 between the heat spreader 50 and the TSVs 42 and/or 74, as shown in FIGS. 9 and 10, defining the electrical isolators 66, as shown in FIGS. 12 and 13. The method can further comprise stacking the top die 26 on the bottom die 22. The method can further comprise applying a thermal interface material 82 on an exposed portion 54 of the heat spreader 50, and between the heat spreader 50 and a metal cap 86 covering the top and bottom dies 26 and 22.

In another example, metallization can be disposed on the extended TSVs to form lateral extensions of the TSVs electrically coupled to another of the top and bottom dies. The method can comprise metallizing the backside of the bottom die outside and spaced-apart from the metallization disposed on the TSVs, defining the metal plane.

In another example, a computing system can comprise a motherboard, and an electronic device package 14 as described above operably coupled to the motherboard, such as by electrically conductive solder material (e.g., solder balls, solder bumps, microbumps). The computing system can comprise a desktop computer, a laptop, a tablet, a smartphone, a server, a wearable electronic device, an embedded computing device, or a combination thereof. The computing system can further comprise a processor, a memory device, a heat sink, a radio, a slot, a port, or a combination thereof operably coupled to the motherboard.

Examples

The following examples pertain to further embodiments.

In one example, there is provided an electronic device, comprising: a pair of electrically coupled dies; and a heat spreader disposed between the pair of dies and electrically isolated from an electrical connection between the pair of dies.

In one example of the electronic device, at least a portion of the heat spreader is exposed from between the pair of dies to dissipate heat from between the pair of dies.

In one example of the electronic device, the heat spreader extends beyond a perimeter of at least one of the pair of dies.

In one example of the electronic device, the heat spreader extends to at least a perimeter of at least one of the pair of dies.

In one example of the electronic device, the heat spreader is disposed on one of the pair of dies.

In one example of the electronic device, the electrical connection further comprises through silicon vias (TSVs) extending through one of the pair of dies and electrically coupled to the other of the pair of dies.

In one example of the electronic device, the heat spreader is laterally isolated from the TSVs by an electrical insulator.

In one example of the electronic device, the heat spreader circumscribes the TSVs and extends between the TSVs.

In one example, the electronic device, further comprises: a first metallization disposed on the TSVs and forming extensions of the TSVs electrically coupled to the other of the pair of dies; a second metallization disposed on one of the pair of dies and defining the heat spreader; and an electrical insulator electrically isolating the second metallization from the first metallization.

In one example, the electronic device further comprises: an exposed portion of the heat spreader extending beyond at least one of the pair of dies; and a thermal interface material disposed on the exposed portion of the heat spreader.

In one example, the electronic device further comprises: a metal cap disposed over the pair of dies; and the thermal interface material extending from the exposed portion of the heat spreader and the metal cap.

In one example of the electronic device, the pair of dies comprises a bottom die and a top die disposed over the bottom die; the electrical connection comprises through silicon vias (TSVs) extending through the bottom die and electrically coupled to the top die; at least a perimeter of the bottom die extends laterally beyond a perimeter of the top die defining a step; and the heat spreader extends from between the top and bottom dies and onto the step.

In one example there is provided an electronic device package, comprising: a substrate; a bottom die disposed over and electrically coupled to the substrate and having through silicon vias (TSVs) extending through the bottom die; a top die disposed over the bottom die and electrically coupled to the TSVs; and a heat spreader embedded between the top and bottom dies and electrically isolated from the TSVs.

In one example of the electronic device package, at least a portion of the heat spreader is exposed from between the top and bottom dies to dissipate heat from between the top and bottom dies.

In one example of the electronic device package, the heat spreader extends beyond a perimeter of at least one of the top and bottom dies.

In one example of the electronic device package, the heat spreader extends to at least a perimeter of at least one of the top and bottom dies.

In one example of the electronic device package, the heat spreader is disposed on at least one of the top and bottom dies.

In one example of the electronic device package, the heat spreader is laterally isolated from the TSVs by an electrical insulator.

In one example of the electronic device package, the heat spreader circumscribes the TSVs and extends between the TSVs.

In one example, the electronic device package further comprises: a first metallization disposed on the TSVs and forming extensions of the TSVs electrically coupled to the top die; a second metallization disposed on the bottom die and defining the heat spreader; and an electrical insulator electrically isolating the second metallization from the first metallization.

In one example, the electronic device package further comprises: an exposed portion of the heat spreader extending beyond the top die; and a thermal interface material disposed on the exposed portion of the heat spreader.

In one example, the electronic device package further comprises: a metal cap disposed on the substrate and over the top and bottom dies; and the thermal interface material extending from the exposed portion of the heat spreader and the metal cap.

In one example of the electronic device package, at least a perimeter of the bottom die extends laterally beyond a perimeter of the top die defining a step; and the heat spreader extends from between the top and bottom dies and onto the step.

In one example there is provided a computing system, comprising: a motherboard; and an electronic device package as in any one of the above examples operably coupled to the motherboard.

In one example of the computing system, the computing system comprises a desktop computer, a laptop, a tablet, a smartphone, a server, a wearable electronic device, an embedded computing device, or a combination thereof.

In one example, the computing system further comprises a processor, a memory device, a heat sink, a radio, a slot, a port, or a combination thereof operably coupled to the motherboard.

In one example there is provided a method for transferring heat from an electronic device package, the method comprising: inserting a heat spreader between an interconnect interface of a top die and a bottom die in the electronic device package; and electrically isolating the heat spreader from electrical connections in the interconnect interface.

In one example of the method, the interconnect interface comprises a backside of the bottom die with exposed through silicon via (TSV) pads and an active layer of the top die.

In one example, the method further comprises extending through silicon vias (TSVs) beyond a backside of a silicon wafer, defining extended TSVs.

In one example, the method further comprises metalizing the backside of the bottom die outside and spaced-apart from the TSVs, defining the heat spreader.

In one example, the method further comprises disposing an electrically insulating compound between the heat spreader and the TSVs.

In one example, the method further comprises stacking the top die on the bottom die.

In one example, the method further comprises applying a thermal interface material on an exposed portion of the heat spreader, and between the heat spreader and a metal cap covering the top and bottom dies.

In one example, the method further comprises a metallization disposed on the extended TSVs and forming lateral extensions of the TSVs electrically coupled to another of the top and bottom dies.

In one example, the method further comprises metalizing the backside of the bottom die outside and spaced-apart from the metallization disposed on the TSVs, defining the metal plane.

In one example, the method further comprises disposing an electrically insulating compound between the metal plane and the metallization disposed on the TSVs.

In one example, the method further comprises applying a thermal interface material on an exposed portion of the heat spreader, and between the heat spreader and a metal cap covering the top and bottom dies.

In one example there is provided a method for making an electronic device package, comprising: providing a substrate; disposing a bottom die over the substrate and electrically coupling the bottom die to the substrate, the bottom die having through silicon vias (TSVs) extending through the bottom die, the bottom die having a heat spreader disposed over the bottom die and electrically isolated from the TSVs; and disposing a top die over the bottom die and electrically coupling the top die to the TSVs.

In one example, the method further comprises applying a thermal interface material to an exposed portion of the heat spreader.

In one example, the method further comprises disposing a metal cap on the substrate and covering the top and bottom dies with the thermal interface material extending to the metal cap.

In one example of the method, the heat spreader extends beyond a perimeter of the top die.

In one example of the method, the heat spreader extends to at least a perimeter of the bottom die.

In one example of the method, the heat spreader is laterally isolated from the TSVs by an electrical insulator.

In one example of the method, the heat spreader circumscribes the TSVs and extends between the TSVs.

In one example, the method further comprises: a first metallization disposed on the TSVs and forming extensions of the TSVs electrically coupled to the top die; a second metallization disposed on the bottom die and defining the heat spreader; and an electrical insulator electrically isolating the second metallization from the first metallization.

In one example there is provided a method for making an electronic device, comprising: providing a silicon wafer with an active layer and through silicon vias (TSVs); applying a barrier or template over a back side of the silicon wafer around the TSVs; applying a metallization layer over the back side of the wafer and in areas exposed by the barrier or template, the metallization layer extending the TSVs to form extended TSVs, the metallization layer defining a heat spreader outside the extended TSVs and separated from the extended TSVs by the barrier or template; removing the barrier or template from the silicon wafer; applying an electrically insulative material over the metallization layer and between the heat spreader and the extended TSVs; and singulating the wafer to form a die.

In one example, the method further comprises applying and removing the barrier or template further comprises: patterning photo resist over the back side of the wafer around the TSVs; and removing the photo resist from between the heat spreader and the extended TSVs.

In one example, the method further comprises disposing the die over a substrate and electrically coupling the die to the substrate.

In one example, the method further comprises removing a portion of the electrically insulative material to expose the heat spreader and the extended TSVs.

In one example of the method, the die defines a bottom die, and further comprises: disposing a top die over the bottom die and electrically coupling the top die to the extended TSVs, defining a die stack.

In one example, the method further comprises applying a thermal interface material to an exposed portion of the heat spreader.

In one example, the method further comprises capping the die stack with a metal cap disposed over the substrate and the die stack, and with the thermal interface material extending from the heat spreader to the metal cap.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic device, comprising:
   a pair of dies electrically coupled with through silicon vias (TSVs); and
   a heat spreader disposed between the pair of dies, wherein the heat spreader is directly coupled to at least one of the pair of dies and electrically isolated from the TSVs, wherein the TSVs extend into the heat spreader, the heat spreader circumscribes the TSVs and extends laterally between the TSVs, and the heat spreader is laterally isolated from the TSVs by an electrical insulator.

2. The electronic device of claim 1, wherein at least a portion of the heat spreader is exposed from between the pair of dies to dissipate heat from between the pair of dies.

3. The electronic device of claim 1, wherein the heat spreader extends beyond a perimeter of at least one of the pair of dies.

4. The electronic device of claim 1, wherein the heat spreader extends to at least a perimeter of at least one of the pair of dies.

5. The electronic device of claim 1, wherein the TSVs extend through one of the pair of dies and electrically couple to the other of the pair of dies.

6. The electronic device of claim 5, further comprising:
   a first metallization disposed on the TSVs and forming extensions of the TSVs electrically coupled to the other of the pair of dies;
   a second metallization disposed on one of the pair of dies and defining the heat spreader; and
   an electrical insulator electrically isolating the second metallization from the first metallization.

7. The electronic device of claim 1, further comprising:
an exposed portion of the heat spreader extending beyond at least one of the pair of dies; and
a thermal interface material disposed on the exposed portion of the heat spreader.

8. The electronic device of claim 7, further comprising:
a metal cap disposed over the pair of dies; and
the thermal interface material extending from the exposed portion of the heat spreader and the metal cap.

9. The electronic device of claim 1, wherein:
the pair of dies comprises a bottom die and a top die disposed over the bottom die;
the electrical connection comprises through silicon vias (TSVs) extending through the bottom die and electrically coupled to the top die;
at least a perimeter of the bottom die extends laterally beyond a perimeter of the top die defining a step; and
the heat spreader extends from between the top and bottom dies and onto the step.

10. An electronic device package, comprising:
a substrate;
a bottom die disposed over and electrically coupled to the substrate and having through silicon vias (TSVs) extending through the bottom die;
a top die disposed over the bottom die and electrically coupled to the TSVs; and
a heat spreader embedded between the top and bottom dies, wherein the heat spreader is directly coupled to at least one of the pair of dies and electrically isolated from the TSVs, wherein the TSVs extend into the heat spreader, the heat spreader circumscribes the TSVs and extends laterally between the TSVs, and the heat spreader is laterally isolated from the TSVs by an electrical insulator.

11. The electronic device package of claim 10, wherein at least a portion of the heat spreader is exposed from between the top and bottom dies to dissipate heat from between the top and bottom dies.

12. The electronic device package of claim 10, wherein the heat spreader extends beyond a perimeter of at least one of the top and bottom dies.

13. The electronic device package of claim 10, wherein the heat spreader extends to at least a perimeter of at least one of the top and bottom dies.

14. The electronic device package of claim 10, further comprising:
a first metallization disposed on the TSVs and forming extensions of the TSVs electrically coupled to the top die;
a second metallization disposed on the bottom die and defining the heat spreader; and
an electrical insulator electrically isolating the second metallization from the first metallization.

15. The electronic device package of claim 10, further comprising:
an exposed portion of the heat spreader extending beyond the top die; and
a thermal interface material disposed on the exposed portion of the heat spreader.

16. The electronic device package of claim 15, further comprising:
a metal cap disposed on the substrate and over the top and bottom dies; and
the thermal interface material extending from the exposed portion of the heat spreader and the metal cap.

17. The electronic device package of claim 10, wherein:
at least a perimeter of the bottom die extends laterally beyond a perimeter of the top die defining a step; and
the heat spreader extends from between the top and bottom dies and onto the step.

* * * * *